United States Patent [19]

Christie et al.

[11] Patent Number: 4,630,356

[45] Date of Patent: Dec. 23, 1986

[54] METHOD OF FORMING RECESSED OXIDE ISOLATION WITH REDUCED STEEPNESS OF THE BIRDS' NECK

[75] Inventors: Rosemary Christie, Hopewell Junction; Bao-Tai Hwang; San-Mei Ku, both of Poughkeepsie, all of N.Y.; Janet M. Sickler, Georgetown, Tex.

[73] Assignee: International Business Machines Corporation, Armonk, N.Y.

[21] Appl. No.: 777,800

[22] Filed: Sep. 19, 1985

[51] Int. Cl.[4] .................. H01L 21/467; H01L 21/76; H01L 21/94

[52] U.S. Cl. .................................. 29/576 W; 29/580

[58] Field of Search ............................ 29/576 W, 580; 148/DIG. 117; 156/644, 653, 650, 643

[56] References Cited

U.S. PATENT DOCUMENTS

| | | | |
|---|---|---|---|
| 3,534,234 | 10/1970 | Clevenger | 317/235 |
| 3,900,350 | 8/1975 | Appels et al. | 148/175 |
| 3,970,486 | 7/1976 | Kooi | 148/187 |
| 4,104,086 | 8/1978 | Bondur et al. | 148/1.5 |
| 4,170,500 | 10/1979 | Crossley | 148/187 |
| 4,272,308 | 6/1981 | Varshney | 148/187 |
| 4,508,757 | 4/1985 | Fabricius et al. | 427/93 |
| 4,516,316 | 5/1985 | Haskell | 29/576 W |

FOREIGN PATENT DOCUMENTS

| | | | |
|---|---|---|---|
| 0071203 | 7/1982 | European Pat. Off. | |
| 0060851 | 4/1986 | Japan | 29/576 W |

OTHER PUBLICATIONS

G. Das et al, "Elimination of Reactive Ion Etching Trench-Induced Defects" May 1981 IBM Technical Disclosure Bulletin, vol. 23, No. 12, p. 5344.

C. G. Jambotkar, "Preventing Formation of Polysilicon Rails" May 1983 IBM Technical Disclosure Bulletin, vol. 25, No. 12, pp. 6607–6609.

B. M. Kemlage et al. "Fabrication of Oxide Isolation Using an Oxynitride/Polysilicon Mask" Feb. 1982, IBM Technical Disclosure Bulletin, vol. 24, No. 9, p. 4756.

D. W. Ormond, "Method of Manufacturing Dielectrically Isolated Regions of Silicon Utilizing High Pressure Steam" Jan. 1981 IBM Technical Disclosure Bulletin, vol. 23, No. 8, pp. 3694–3697.

Doo, V. Y., "Method of Making High Density Ink Jet Nozzles" IBM Technical Disclosure Bulletin, vol. 23, No. 7A Dec. 1980, p. 2759.

Rideout et al., "Fabricating Recessed Oxide Isolation Regions in Silicon Substrates", IBM Technical Disclosure Bulletin, vol. 17, No. 3, Aug. 1974, pp. 949–951.

Primary Examiner—Brian E. Hearn
Assistant Examiner—Kevin McAndrews
Attorney, Agent, or Firm—T. Rao Coca

[57] ABSTRACT

Disclosed is a method of forming in a monocrystalline silicon body an optimum recessed oxide isolation structure with reduced steepness of the bird's neck. Starting from a monocrystalline silicon body, there is formed thereon a layered structure of first silicon dioxide, polycrystalline silicon, second silicon dioxide and silicon nitride, in that order. The layers are patterned to form openings in the structure at the areas where it is desired to form the oxide isolation pattern within the silicon body. The exposed areas of the silicon body are anisotropically reactive ion etched to an initial portion of the desired depth obtaining the corresponding portion of the trench having substantially vertical walls. Then by chemical etching the trench is extended to a final portion of the desired depth obtaining inwardly sloped walls in the final portion. The body is then thermally oxidized until the desired oxide isolation penetrates to the desired depth within the silicon body.

18 Claims, 4 Drawing Figures

METHOD OF FORMING RECESSED OXIDE ISOLATION WITH REDUCED STEEPNESS OF THE BIRDS' NECK

BACKGROUND OF THE INVENTION

1. Technical Field

The invention relates to the manufacture of a semiconductor structure having an optimum dielectric isolation and, more particularly, to a method of forming recessed oxide isolation structure with reduced steepness of the bird's neck in a silicon substrate.

2. Description of the Prior Art

In the semiconductor integrated circuit production, it is usually necessary to isolate various active and/or passive devices from one another in the integrated circuit structure. These devices have been isolated by back biasing PN junctions, partial dielectric isolation and complete dielectric isolation. The dielectric materials used have been silicon dioxide and the like. The preferred isolation for these active devices and circuits is some form of dielectric isolation which may include a combination with PN junction isolation. The dielectric isolation has the substantial advantage over the PN junction isolation because it allows the butting of the circuit elements against the isolation and thereby results in greater density of packing of the active and/or passive device on the integrated circuit chip.

One form of dielectric isolation is the Recessed Oxide Isolation (ROI). This approach which dates back to the early 1970's, involves chemically etching grooves or recesses in silicon where the isolation regions are to be formed. During the groove formation, the remainder of the silicon surface is protected by a mask called the ROI mask which is substantially unaffected by the etchant used to form the grooves in the silicon. Following the formation of the grooves the silicon body is subjected to thermal oxidation whereby the silicon in the groove area is converted to silicon dioxide filling up the groove as well as oxidizing further into the silicon to form the recessed oxide isolation region. Thus, in ROI formation, the ROI mask is first used as an etch barrier while recesses are etched through the mask openings in the silicon and is then used as an oxidation mask during thermal oxidation of the recesses. A composite silicon dioxide-silicon nitride mask has been widely used in this dual role. The ROI process is more fully described by U.S. Pat. Nos. 3,970,486 to E. Kooi, 3,534,234 to Peltzer and U.S. patent application Ser. No. 150,609 by I. Magdo et al. filed June 7, 1971.

Recently, the formation of grooves in silicon and filling them with a dielectric has been significantly improved by using other materials for the ROI mask than oxide-nitride composite, by substituting wet etching with dry reactive ion etching (RIE) technique to etch the grooves, and by filling the grooves with a dielectric material other than oxide to form the device isolation. In this context, reference is made to the article entitled "Elimination of Reactive Ion Etching trench induced defects", by G. Das et al, IBM Technical Disclosure Bulletin, Vol. 23, No. 12, page 5344, May 1981, and U.S. Pat. No. 4,104,086 to J. A. Bondur et al. and assigned to the present assignee.

One of the major problems associated with the above ROI process is what is known as "bird's beak". The "bird's beak" is a silicon dioxide formation at the top periphery of the groove and is caused by the lateral oxidation underneath the silicon nitride layer. Since the oxidation of a specific thickness of silicon requires an almost equivalent amount of free space to expand into, and since the nitride limits the unrestricted expansion, the result is an up-pushing of the silicon nitride at the edge of the groove. Associated with the bird's beak is the bird's head, an undesirable bump in the order of 400-500 nm in height formed in the edge of the thick oxide layer adjoining the oxide-nitride mask. For a more complete understanding of the theory behind the bird's head and bird's beak phenomena, reference is made to U.S. Pat. No. 3,900,350 to J. A. Appels et al. Associated sometimes with the bird's head is an excessively steep bird's neck stemming from excessive etching of the planar surface portions of the ROI during removal of the ROI mask.

The existence of the bird's head or bird's beak incurs many disadvantages. The device active area is reduced and the isolation area is increased by the bird' beak. This is disadvantageous since chip real estate, particularly in very large scale integrated (VLSI) circuits, is at a premium. Because of the bird's beak, it is difficult to achieve well-defined lateral isolation boundaries. Because of the bird's head, the top surface of the resulting ROI structure will not be substantially planar with the top surface of the silicon. As a result, electrode interconnections formed on the ROI regions are prone to be fractured and disconnected. Another drawback of nonplanarity is poor coverage of metal lands over the corners and edges of the surface topography leading to unreliability of the integrated circuit. Yet another disadvantage is that the nonplanar surface would not be conducive for multi-level conductive personalization demanded by high performance VLSI circuits. A further problem, which is a direct result of an excessively steep bird's neck and which is discussed more fully in the article entitled "Preventing Formation of Polysilicon Rails" by C. G. Jambotkar, IBM Technical Disclosure Bulletin, Vol. 25, No. 12, pages 6606-6609, May 1983, is the formation of polysilicon rails after forming a polysilicon layer on the nonplanar surface and etching the polysilicon by RIE into polysilicon base and/or emitter contacts of a bipolar transistor. The polysilicon rails tend to electrically short-out adjacent devices destroying the benefit of the ROI.

The foregoing are representative of the numerous disadvantages associated with the bird's beak and bird's head. Thus, it is readily apparent that it is desirable to reduce or eliminate the bird's beak and bird's head associated with ROI. Reduction in bird's head may, in general, result in some reduction in the steepness of the bird's neck.

Attempts have been made in the prior art to reduce the bird's beak and bird's head problems. For example, the J. A. Appels et al. U.S. Patent cited hereinabove describes a method to overcome the bird's beak problem. This patent suggests the substitution of a layer of polycrystalline silicon for the silicon dioxide layer between the silicon nitride masking layer and the monocrystalline silicon body. The patent states that the oxidation of monocrystalline silicon is not noticeably different from oxidation of polysilicon. However, the bird's beak is greatly reduced by introducing the polysilicon as a buffered layer between the oxide and the nitride. This polysilicon layer was also found to dampen the mechanical stress caused by the silicon nitride when directly applied to the silicon.

U.S. Pat. No. 4,272,308 to R. C. Varshney discloses deposition on the oxide-nitride dual mask including the sidewalls thereof, prior to thermal oxidation, a second nitride layer. The second nitride serves to seal off lateral oxidation underneath the first nitride during the thermal oxidation of the exposed silicon thereby reducing the bird's beak.

U.S. Pat. No. 4,170,500 to P. A. Crossley discloses a process of forming dielectric isolation by first forming on the silicon substrate a dual oxide-nitride layer. Then, polysilicon is formed on the surface of the nitride layer in region corresponding to where device isolation is required. The polysilicon is next fully oxidized followed by etching off the exposed oxide-nitride dual mask leaving a stack of oxide-nitride-oxide serving as dielectric isolation free of bird's beak/head.

European Patent Application No. 82106651.1 (publication No. 0 071 203) by B. M. Kemlage and assigned to the present assignee discloses a method of reducing the bird's head. In this method the oxide pad in the oxide-nitride dual layer is replaced with a silicon oxynitride ($SiO_xN_y$) layer. The oxynitride acts as a barrier to rapid oxidation during the thermal oxidation step, thereby reducing the bird's head.

The article entitled "Fabrication of Oxide Isolation Using an Oxynitride/Polysilicon Mask" by B. M. Kemlage et al., IBM Technical Disclosure Bulletin, Vol. 24, No. 9, February 1982, page 4756, proposes an oxynitride/polysilicon stack mask. The oxynitride while serving as an effective oxidation mask imposes lesser stress on the silicon than nitride during thermal oxidation. The polysilicon serves as a buffer inhibiting oxidation under the oxynitride thereby eliminating the bird's beak and excessive bird's head.

The article entitled "Method of Manufacturing Dielectrically Isolated Regions of Silicon Utilizing High Pressure Steam" by D. W. Ormond, IBM Technical Disclosure Bulletin Vol. 23, No. 8, January 1981, pp 3694–3697 discloses use of a polysilicon layer sandwiched between the pad oxide and nitride layers of the ROI mask in the context of high pressure oxidation of the silicon to form ROI. The polysilicon is believed to reduce the large stresses caused by the nitride during high pressure oxidation and also reduce the bird's beak.

Despite the improvement in suppressing the bird's beak and bird's head exemplified by the above prior art, there is need for further improvement since these prior art attempts have been basically deficient. The deficiencies arise because the prior art attempts either to not completely solve the problem or else introduce additional problems such as defects at the silicon surface under the ROI mask or give rise to difficulties in implementing the processes in a high volume manufacturing environment, the latter principally due to lack of controllability of the process.

Reference is now made to U.S. Pat. No. 4,508,757 to K. A. Fabricius, et al. and assigned to the present assignee which discloses a method for reducing the bird's beak. In accordance with the Fabricius et al. process, which in relevant part, can be understood with reference to FIG. 1, ROI with reduced beak formation is obtained by starting with a P-type monocrystalline silicon body 10 having an N-type epitaxial layer 11 on the top surface thereof. A layered structure of silicon dioxide 12, polysilicon 13 and silicon nitride 14 are formed, in that order, on the epitaxial layer 11. The thickness of the oxide layer 12 is about 2-10 nm, polysilicon 13 is about 5-500 nm and nitride 14 is about 10-500 nm. The layers 12-13-14 are then patterned by conventional lithography and RIE to form openings in the structure at the areas where it is desired to form an oxide isolation pattern within the body 10. Then, grooves are formed in the epi layer 11, preferably, by continuing the RIE process utilized to define the openings in the layers 12-13-14. The resulting structure is now subjected to a high temperature oxidizing treatment forming the ROI regions 15. The nitride 14 is then removed by a hot phosphoric acid dip etching solution. The polysilicon 13 is then either etched off in full or partially etched followed by conversion of the remaining polysilicon into an oxide layer (not shown) atop the oxide 12.

The Fabricius et al. process, although substantially reduces the beak length 16 and bird's head or crest height 17, requires arduous process control lest a rather pointed bird's head or steep bird's neck 18 is obtained which would lead, among other things, to the polysilicon rail problem previously discussed. The reason for this undesirably steep neck 18 is the formation of a thin silicon oxynitride layer (not shown) on the top of the polysilicon 13 during the initial phase of the nitride 14 deposition. The oxynitride does not lend itself to easy removal, following the ROI 15 formation, causing the thinning and consequent steepening of the bird's neck. Also, the oxynitride inhibits oxidation of the polysilicon 13 during the final process step to convert the polysilicon 13 into an oxide layer.

It is an object of the invention to provide a method of forming ROI regions having reduced bird's beak and bird's head.

It is an object of the invention to provide a controllable method of forming ROI regions having bird's neck of a reduced steepness.

The above objects and other related objects and advantages are achieved through the use of a novel ROI mask and novel combination of etch steps.

SUMMARY OF THE INVENTION

In accordance with the present invention a method of making a monocrystalline integrated circuit structure having ROI regions of a profoundly reduced steepness of the bird's neck is provided. Starting with a monocrystalline silicon body, there is formed thereon a layered structure of a first silicon dioxide, polycrystalline silicon, second silicon dioxide and silicon nitride in the specified order. The provision of the second oxide layer between the polycrystalline silicon and the nitride eliminates a tanacious silicon oxynitride film on the polycrystalline silicon which would otherwise be formed during the initial stages of formation of nitride. The layers are then patterned to form openings in the structure corresponding to the areas where it is desired to form an oxide isolation pattern within the silicon body. To form a fully recessed oxide isolation, initially the exposed silicon is etched by RIE to a first depth obtaining trenches having substantially vertical walls. The body is then subjected to a wet chemical etching process to extend the trenches to a second depth and obtain inwardly sloped walls in the extended portion. The exposed body is then thermally oxidized until the desired oxide isolation pattern penetrates to the desired depth within the silicon body. The layer structure is then readily and controllably removed obtaining ROI defined regions with reduced steepness of the bird's neck. Easy and controlled removal of the layered structure is faciliated because of the absence of silicon oxynitride in the structure. Since the ROI regions are not excessively etched during the layered structure removal, a reduction in the steepness of the bird's neck will result.

BRIEF DESCRIPTION OF THE DRAWINGS

The novel features, individual process steps and their combination are set forth in the appended claims. The invention itself, however, will be best understood by reference to the detailed description which follows in conjunction with the accompanying drawings, wherein:

DETAILED DESCRIPTION OF THE PREFERRED EMBODIMENT

Figure 1:
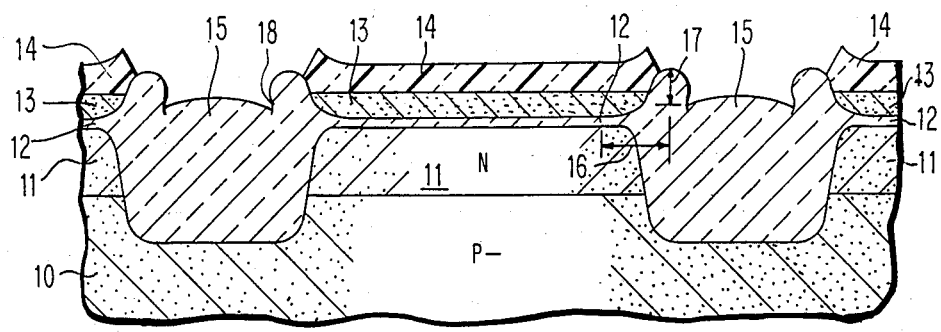
FIG. 1 is a cross sectional view of a semiconductor structure fabricated in accordance with the prior art showing obtained shape for the ROI regions together with their associated bird's head, bird's beak and bird's neck.
Figure 2:
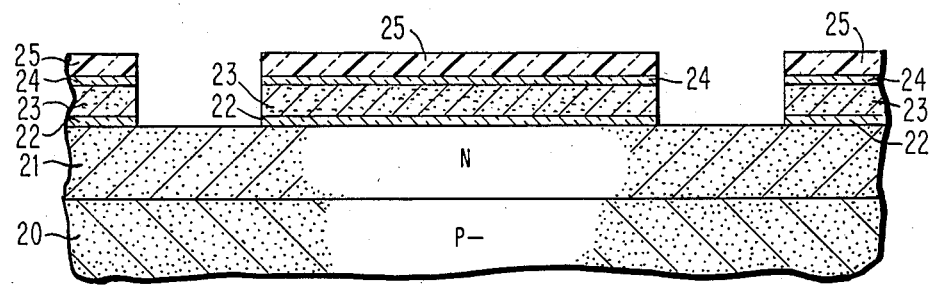
FIGS. 2-4 are flow diagrams illustrating by sequential cross-sectional representation the process steps of the present invention culminating in a ROI structure having reduced steepness of bird's neck.
Figure 3:
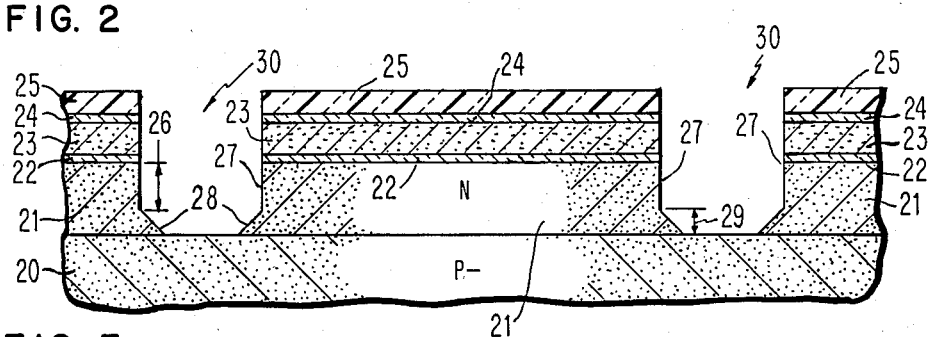
Figure 4:
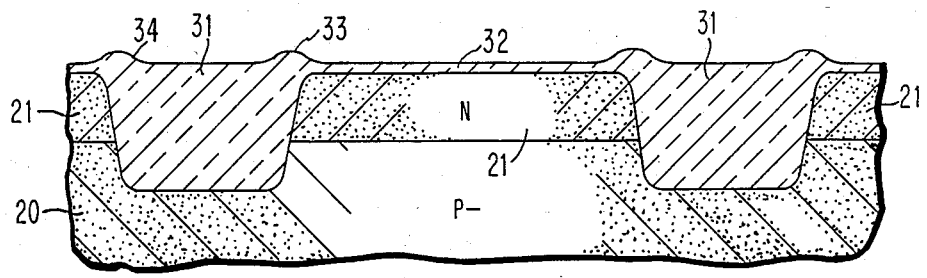

Referring now more particularly to FIGS. 2-4, the process steps for an ROI structure utilizing the present method is described. Referring now to FIG. 2 in particular, the present method is initiated by starting from a P-type substrate of a monocrystalline silicon 20 having grown on top thereof an N-type epitaxial layer 21. The substrate 20 is typically a <100> crystallographic orientation silicon wafer having a resistance of the order of 10-20 Ohm-cm. The epitaxial layer 21 growth process may be by conventional techniques such as the use of SiCl$_4$/H$_2$ or SiH$_4$ gases at a temperature of about 1000° C. to 1200° C. The thickness of the epi layer 21 for dense VLSI-type circuits is of the order of about 2000 nm or less.

The next series of process steps form the masking pattern for the oxidation procedure which forms the ROI pattern. The ROI mask structure is formed of layers of silicon dioxide 22, polycrystalline silicon 23, silicon dioxide 24 and silicon nitride 25 formed in that order upon the monocrystalline silicon body 20, 21. It is preferred that the silicon dioxide layer 22 is composed of a thermal silicon dioxide layer of between about 5 and 10 nm in thickness. The silicon dioxide layer 22 is typically grown at a temperature between about 700° C. and 900° C. in dry oxygen ambient. The preferred temperature is about 800° C. for this oxidation. The polycrystalline silicon 23 has a thickness in the range of approximately 30-80 nm. The polycrystalline silicon layer 23 is deposited by chemical vapor deposition at a fixed temperature in the range of about 550° C. to 800° C. The preferred polysilicon deposition temperature is about 625° C. Reactants for this deposit are silane in a carrier gas such as hydrogen or nitrogen.

The second silicon dioxide layer 24 is rather thin, typically of a thickness in the range 3-7 nm and preferably about 5 nm. The oxide 24 is obtained by thermally oxidizing the upper surface of the polysilicon 23 at a temperature in the range of approximately 800° C. to 1000° C. in a dry oxygen ambient. Alternatively, the silicon dioxide layer 24 may be formed by chemical vapor deposition using well-known techniques.

The silicon nitride 25 is typically of a thickness between about 30-70 nm and preferably about 50 nm thickness. It may be deposited by, for example, low pressure chemical vapor deposition in the temperature range of about 700° C. to 1200° C. Reactants for this deposit are silicon containing gas such as SiH$_4$, SiClH$_3$, SiCl$_2$H$_2$, SiCl$_3$H or SiCl$_4$ and ammonia either with or without a carrier gas such as nitrogen.

The thin silicon dioxide layer 24 sandwiched between the polycrystalline silicon 23 and silicon nitride 25 serves an important function and is critical to the invention. It prevents nitrogenation of the top surface of the polycrystalline silicon layer 23 and consequent formation of silicon oxynitride layer (not shown) during the initial phase of the subsequent silicon nitride 25 deposition. Formation of silicon oxynitride is disadvantageous since it renders the ROI fabrication process totally uncontrollable. The uncontrollability stems from the uncertainties associated with the thickness, uniformity and homogeneity of the silicon oxynitride which will lead to excessive etching of the recessed oxide isolation during removal of the ROI mask which will, due to the tenacious nature of the oxynitride to conventional wet etchants, lead to thinning of the ROI regions and undesirably increase the steepness of the bird's neck.

The layers 22, 23, 24 and 25 are now required to be patterned to form the mask pattern for the formation of the recessed oxide isolation. The patterning is done by conventional lithographic and etching techniques. A photoresist layer (not shown) is deposited over the top silicon nitride layer 25 of the four-layered structure. The resist is exposed using conventional photolithographic techniques and developed having the desired patterns of openings therein. The resist mask is then utilized to first etch the silicon nitride layer 25, then the thin silicon dioxide layer 24, the polycrystalline silicon layer 23 and finally the silicon dioxide layer 22 down to the monocrystalline silicon epitaxial layer 21 as illustrated. The remaining resist layer is then removed obtaining the structure shown in FIG. 2.

Next, referring to FIG. 3, using the four-layer structure 22-23-24-25 as a mask, the exposed portions of the epitaxial monocrystalline silicon layer 21 is subjected to anisotropic RIE to etch a portion of trenches or grooves into the layer 21. The preferred method is to continue the reactive ion etch in a fluorinated gas such as carbon tetrafluoride which is used to etch the silicon nitride layer 25, the thin oxide layer 24, the polycrystalline silicon layer 23 and the silicon dioxide layer 22. The RIE of the silicon 21 is continued until a depth designated by numeral 26 is reached. The depth 26 of the trench is determined by the desired final depth of the trench in the silicon layer 21 which, in turn, is determined by the desired silicon dioxide isolation thickness to be grown and the desired planarity with the adjacent silicon structure. For a final trench depth of 400 nm the depth 26 is approximately 200-300 nm. In other words, the RIE step is continued until the monocrystalline silicon layer 21 is etched to about 50-75% of the intended final depth of the trenches therein. The partially-defined trench, as indicated in FIG. 2, will have substantially vertically walls 27 and substantially horizontal floor (not shown).

Following the RIE step to etch a substantial portion of the trench, wet chemical etching is employed to not only complete the etching of the trench, but also obtain a bottom portion of the trench which has inwardly sloped walls 28 as indicated in FIG. 3. The depth of the bottom portion of the trench having sloped sides is designated by numeral 29. Typically, the angle of inclination of the sloped sides with respect to the vertical is in the range of approximately 40°-50°. The exact angle of inclination is governed by the degree of derivation of the trench walls 27 from verticality of the completion of the trench RIE step. When the walls 27 are vertical, the angle of inclination of the sloped walls 28 would be approximately 45° from the vertical. One example of the chemical etchant which can provide these sloped walls is pyrocatechol. Another wet etchant is a mixture of chromium trioxide, hydrogen fluoride and deionized water. The trenches or grooves 30 formed in this manner typically extend to the top of the monocrystalline silicon body 20.

The resulting structure is now subjected to an oxidizing treatment which is, for example, by heating the body to a temperature of about 1000° C. in a ramped furnace using a steam atmosphere. The result of this process step is given in FIG. 4 wherein the recessed oxide isolation regions 31 are shown. Since the oxidation process will consume the silicon, at the bottom of the grooves 30 in the formation of the silicon dioxide dielectric regions 31, these regions 31 will extend down into the body of the silicon 20.

Following the oxidation process growing the ROI regions 31, the four-layer mask stack 22-23-24-25 is removed obtaining the structure shown in FIG. 4. The silicon nitride layer 25 is removed, for example, by first dipping in a 7:1 buffered hydrogen fluoride (BHF) solution for a short period of time followed by etching in a hot phosphoric acid. The thin silicon dioxide layer 24 is removed by using BHF. The polycrystalline silicon layer 23 is then removed by using pyrocatechol. Finally, the silicon dioxide layer 22 is removed by BHF. Alternatively, the oxide layer 22 may be left in place for utilization in subsequent processing of the structure. If the oxide layer 22 is removed, a fresh new layer of oxide 32 may be grown on the exposed epitaxial silicon 21 by thermal oxidation thereof.

As is clear from FIG. 4, the recessed oxide isolation structure obtained in accordance with the present process is an optimum dielectric isolation structure having a substantially flattened bird's head 33 and a bird's neck 34 of substantially lower steepness compared to the structures obtained by prior art processes. The resulting structure is without the problems of defects in the epitaxial layer 21. Since the slope of the bird's neck is substantially reduced, the ROI structure will be free of the polysilicon rail problems. Since the process eliminates silicon oxynitride formation atop the polycrystalline silicon, it offers controllability which is vital to high volume manufacturing.

Thus, there has been provided in accordance with the invention, a process that fully satisfies the objects and advantages of set forth above.

While the invention has been described in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as fall within the true scope and spirit of the invention.

What is claimed is:

1. Method of forming a recessed oxide isolation with reduced steepness of the bird's neck in a silicon substrate comprising:
    providing a semiconductor silicon substrate;
    forming on said substrate surface a mask stack of first silicon dioxide layer, polycrystalline silicon layer, second silicon dioxide layer and silicon nitride layer in that order;
    patterning said mask stack to form openings at the areas where it is desired to form an oxide isolation pattern within said semiconductor substrate;
    anisotropically reactive ion etching the silicon substrate exposed by the openings in said stack to a first portion of the desired depth obtaining therein trenches having substantially vertical walls;
    chemically etching said silicon substrate to extend the trenches to a second portion of the desired depth and obtain inwardly sloped walls in the second portion; and
    thermally oxidizing the exposed silicon in said trenches to form said isolation with reduced steepness of the bird's neck.

2. The process as recited in claim 1 wherein said patterning is achieved by anisotropic reactive ion etching.

3. The process as recited in claim 1 wherein said first silicon dioxide layer is grown by thermal oxidation of said substrate.

4. The process as recited in claim 1 wherein said second silicon dioxide layer is obtained by thermal oxidation of said polycrystalline silicon layer.

5. The process as recited in claim 1 wherein said depth of said first portion is about 50% to 75% of said desired depth.

6. The process as recited in claim 1 wherein the slope of said inwardly sloped walls is about 45° with respect to the vertical.

7. The process as recited in claim 1 further comprising removing said mask stack by chemically etching.

8. The process as recited in claim 1 wherein said first silicon dioxide layer thickness is between about 5 to 10 nm.

9. The process as recited in claim 1 wherein said second silicon dioxide layer thickness is between about 3-7 nm.

10. The process as recited in claim 1 wherein the thickness of said polycrystalline silicon is between about 30-80 nm.

11. The process as recited in claim 1 wherein the thickness of the silicon nitride is between about 30-70 nm.

12. The process as recited in claim 7 wherein said polycrystalline silicon is removed by using pyrocatechol.

13. Method for manufacturing a monolithic integrated circuit structure comprising:
    providing a monocrystalline silicon body;
    forming on said silicon body a mask stack of first silicon dioxide, polycrystalline silicon, second silicon dioxide and silicon nitride layers, in that order;
    anisotropically reactive ion etching through said mask stack in the area of said silicon body where it is desired to form an oxide isolation pattern within said body;
    continuing said etching into said silicon body to a portion of the desired depth;
    chemically etching said silicon body to the said desired depth whereby the sides of the trench in said silicon body are sloped; and
    thermally oxidizing the exposed silicon in said trench to form recessed oxide isolation with reduced steepness of the bird's neck.

14. The process as in claim 13 wherein the sides of said trench are sloped inward.

15. The process as in claim 13 wherein said second silicon dioxide layer is relatively thin compared to said first silicon dioxide layer.

16. The process as in claim 13 further comprising the following said thermal oxidation step, the steps of:
   removing said silicon nitride by using hot phosphoric acid;
   chemically removing said second silicon dioxide layer by using buffered hydrofluoric acid; and
   chemically removing said polycrystalline silicon layer by using pyrocatechol solution.

17. The process as in claim 14 wherein the angle of inclination with the vertical of said sloped sides is in the range of approximately 40–50 degrees.

18. The process as in claim 17 wherein said portion is about 50% to 70% of said desired depth.

* * * * *